United States Patent
Akimoto

[11] Patent Number: 5,415,719
[45] Date of Patent: May 16, 1995

[54] TWO PARALLEL PLATE ELECTRODE TYPE DRY ETCHING APPARATUS

[75] Inventor: Takeshi Akimoto, Tokyo, Japan

[73] Assignee: NEC Corporation, Tokyo, Japan

[21] Appl. No.: 132,822

[22] Filed: Oct. 7, 1993

[30] Foreign Application Priority Data

Oct. 8, 1992 [JP] Japan .................................. 4-270075
Apr. 13, 1993 [JP] Japan .................................. 5-085822

[51] Int. Cl.6 ............................................... H05H 1/00
[52] U.S. Cl. ................................ 156/345; 204/298.37; 204/298.38
[58] Field of Search .............................. 156/643, 345; 118/723 MA, 723 MW; 204/298.37, 298.38

[56] References Cited

U.S. PATENT DOCUMENTS

| | | | |
|---|---|---|---|
| 4,776,918 | 10/1988 | Otsubo et al. | 156/345 |
| 5,034,086 | 7/1991 | Sato | 156/345 |
| 5,162,633 | 11/1992 | Sonobe et al. | 156/345 X |
| 5,173,641 | 12/1992 | Imahashi et al. | 204/298.37 X |
| 5,203,960 | 4/1993 | Dandl | 156/643 |

FOREIGN PATENT DOCUMENTS

| | | |
|---|---|---|
| 0477906 | 4/1992 | European Pat. Off. . |
| 2-132827 | 5/1990 | Japan . |
| 2-141576 | 5/1990 | Japan . |

OTHER PUBLICATIONS

By K. Komachi et al., "Resist Ashing at Room Temperature using Surface Wave Plasma", Oct. 1990, Abstract No. 463, pp. 674–675, Princeton, N.J.

Primary Examiner—Thi Dang
Attorney, Agent, or Firm—Young & Thompson

[57] ABSTRACT

In a plasma generating chamber, two parallel plate type electrodes are provided, and a dielectric line member is mounted on one of the electrodes. The dielectric line member is connected to a microwave oscillator, to generate gas plasma uniformly in the plasma generating chamber. A high frequency bias power supply source is connected to the other electrode.

9 Claims, 8 Drawing Sheets

TWO PARALLEL PLATE ELECTRODE TYPE DRY ETCHING APPARATUS

BACKGROUND OF THE INVENTION

1. Field of the Invention

The present invention relates to a dry etching apparatus used in the manufacture of semiconductor devices, and more particularly, to a two parallel plate electrode type dry etching apparatus using microwaves.

2. Description of the Related Art

A dry (plasma) etching apparatus has been broadly used in obtaining a fine structure of semiconductor devices. Particularly, when use is made of microwaves, the isotropic etching characteristic is excellent, the energy of ions can be arbitrarily controlled, and a fine structure having a large aspect ratio can be obtained.

In a prior art dry etching apparatus (see: JP-A-SHO56-155535), microwaves generated in a microwave oscillator are supplied along a waveguide through a microwave introduction window into a plasma generating chamber, to thereby excite plasma. Then, the excited plasma is supplied from the plasma generating chamber via a plasma intake window into a substrate processing chamber, to thereby etch a semiconductor substrate. This will be explained in detail later.

In the above-mentioned prior art dry etching apparatus, however, since a region where the excited plasma is uniform is limited by the size of the microwave introduction window and the size of the plasma intake window, the etching rate is not uniform, particularly in a large size semiconductor substrate such as an 8 inch (20.3 cm) wafer.

In order to make the etching rate for a large size semiconductor substrate uniform, one suggested approach may be to enlarge the microwave introduction window as well as the plasma intake window; however, this approach is actually impossible, since the size of the microwave introduction window is determined by the wavelength of the microwaves. That is, in the plasma generating chamber, the microwaves are distributed in accordance with the intensity thereof, and the density distribution of the excited plasma is also dependent upon the distribution of the microwaves. Also, in this prior art dry etching apparatus, in order to define the spread of the excited plasma in the lateral direction to thereby make the density of the excited plasma uniform, a large electromagnet is provided to apply a magnetic field to the excited plasma, which is disadvantageous in size.

In another prior art dry etching apparatus, where two parallel plate electrodes are provided within a plasma generating chamber which also has mounted thereon a semiconductor substrate to be etched, the uniformity of density of excited plasma is controlled by the pressure thereof. Also in this type of dry etching apparatus, however, it is actually impossible to make the etching rate in a large size semiconductor substrate uniform. In order to effectively make the density of the excited plasma uniform, a plurality of holes are provided in a grounded electrode, and the number of the holes is controlled mechanically by a value mechanism to control all of the excited plasma supplied to the semiconductor substrate (see: JP-A-HEI1-165122). In this prior art dry etching apparatus, however, the flow of the excited plasma is not uniform, so that a time lag is required until the density of the excited plasma becomes stable, and also, it is disadvantageous to mechanically control the value mechanism.

SUMMARY OF THE INVENTION

It is an object of the present invention to provide a dry etching apparatus which can make the etching rate for a large size semiconductor substrate uniform.

According to the present invention, in a plasma generating chamber, two parallel plate type electrodes are provided, and a dielectric line member is mounted on one of the electrodes. The dielectric line member is connected to a microwave oscillator, to generate gas plasma uniformly in the plasma generating chamber. A high frequency bias power supply source is connected to the other electrode.

BRIEF DESCRIPTION OF THE DRAWINGS

The present invention will be more clearly understood from the description as set forth below, in comparison with the prior art, with reference to the accompanying drawings, wherein.

DESCRIPTION OF THE PREFERRED EMBODIMENTS

Before the description of embodiments, a prior art dry etching apparatus will be explained with reference to FIG. 1.

Figure 1:
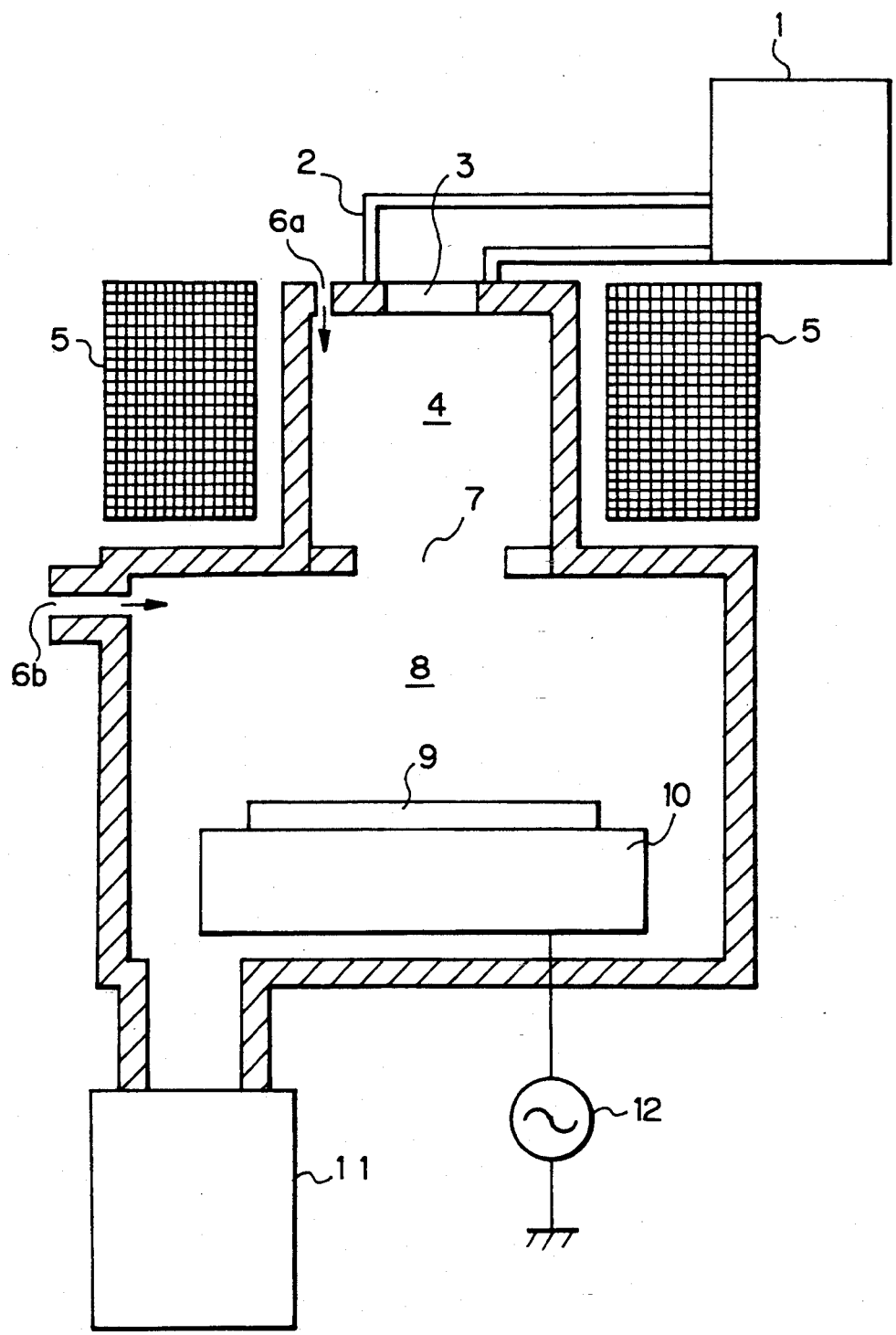
FIG. 1 is a cross-sectional view illustrating a prior art dry etching apparatus.

In FIG. 1, microwaves generated in a microwave oscillator 1 are propagated along a waveguide 2 through a microwave introduction window 3 into a plasma generating chamber 4, to thereby create an electric field having a frequency such as 2450 MHz. Simultaneously, a magnetic field such as $875 \times 10^{-4}$T approximately perpendicular to the electric field is generated by supplying a current to a solenoid winding 5. Thus, an electron cyclotron resonance (ECR) produced by the electric field and the magnetic field occurs to excite gas taken in from a gas inlet 6. The excited plasma is driven along the magnetic field via a plasma intake window 7 into a substrate processing chamber 8, to thereby etch a semiconductor substrate 9 mounted on a substrate holder 10. Reference 6b designates another gas inlet. The pressure of the excited plasma within the substrate processing chamber 8 is controlled to a definite value by a vacuum exhaust system 11. Also, the ion energy of plasma is controlled by a high frequency bias power supply source 12 connected to the substrate holder 10.

In the dry etching apparatus of FIG. 1, however, as explained above, since a region where the excited plasma is uniform is limited by the size of the microwave introduction window 3 and the size of the plasma intake window 7, the etching rate is not uniform, particularly in a large size semiconductor substrate such as an 8 inch (20.3 cm) wafer.

Figure 2:
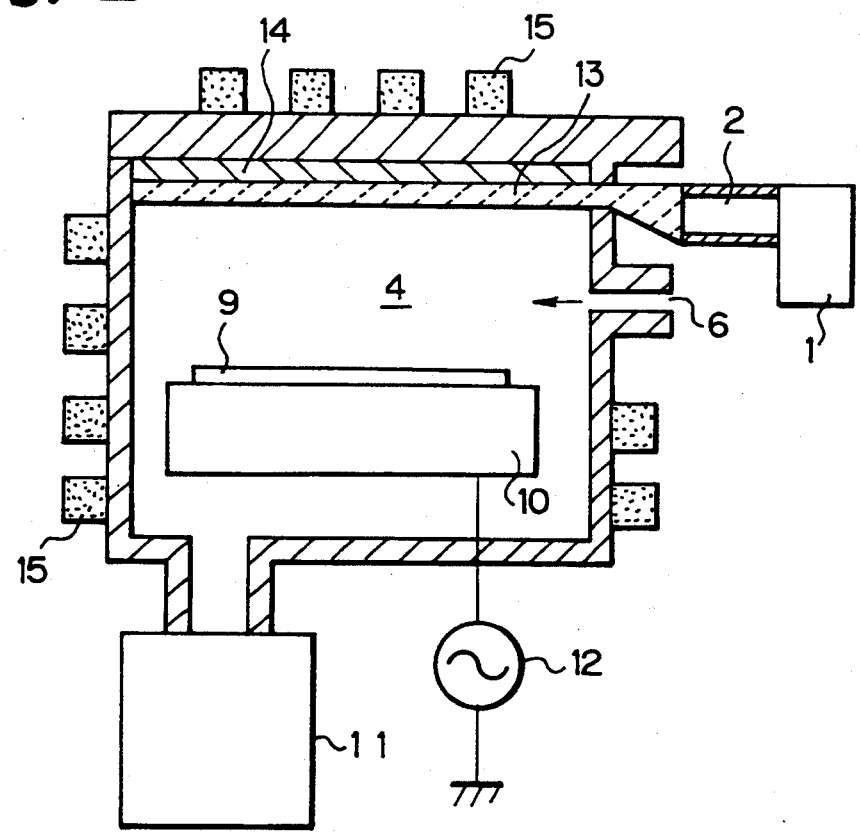
FIG. 2 is a cross-sectional view illustrating a first embodiment of the dry etching apparatus according to the present invention.

In FIG. 2, which illustrates a first embodiment of the present invention, the plasma generating chamber 4 also serves as the substrate processing chamber 8 of FIG. 1, and therefore, the plasma intake window 7 and the substrate processing chamber 8 of FIG. 1 are not provided. Also, a dielectric line member 13, which is made of polytetrafluorethylene (PTFE), fluorocarbon resin or quartz for introducing microwaves into the plasma generating chamber 1 is provided, and therefore, the microwave introduction window 3 of FIG. 1 is not provided.

Further, in FIG. 2, a two parallel plate electrode structure is used, to thereby treat a large size semiconductor substrate. That is, an upper electrode 14 is provided on the back side of the dielectric line member 13, while the substrate holder 10 serves as a lower electrode.

Figure 3:
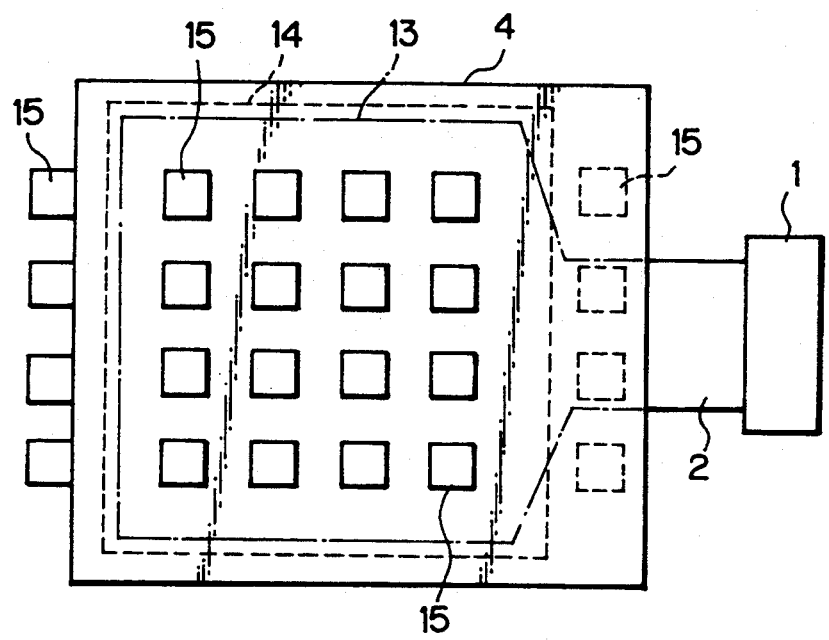
FIG. 3 is a plan view of the dry etching apparatus of FIG. 2.

As illustrated in FIG. 3, which is a plan view of FIG. 2, the dielectric line member 13 has a large microwave emission surface. Also, the area of the upper electrode 14 is approximately the same as that of the dielectric line member 13.

Figure 4A:
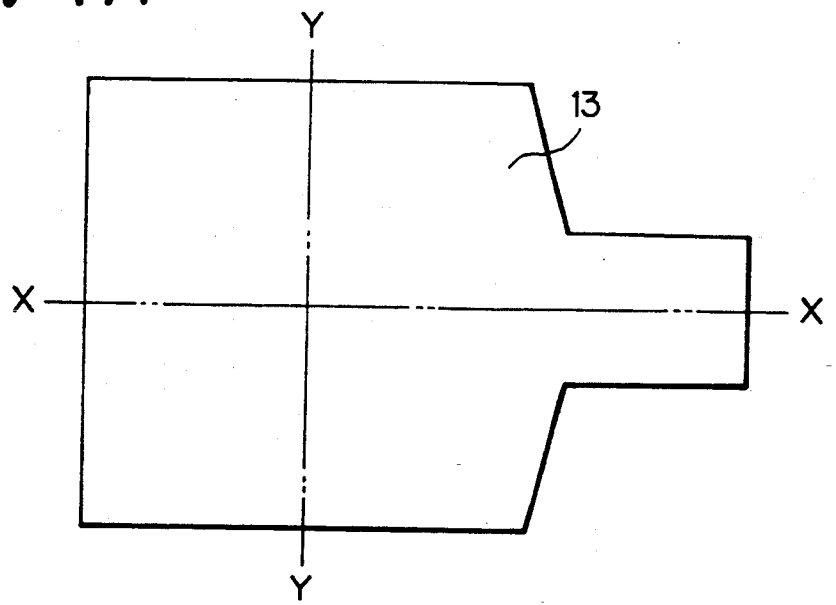
FIG. 4A is a plan view of the dielectric line member of FIG. 3.
Figure 4B:
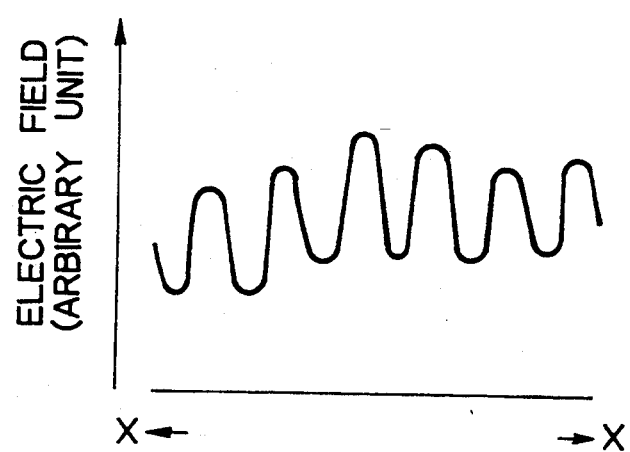
FIGS. 4B and 4C are waveforms showing an electric field generated within the dielectric line member of FIG. 4A.
Figure 4C:
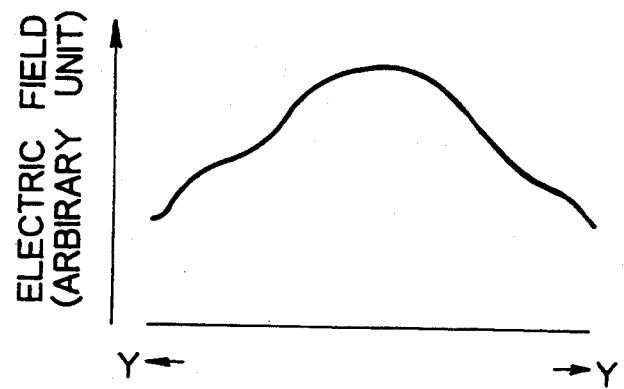

In FIG. 2, microwaves generated in the microwave oscillator 1 propagate along the waveguide 2, and further propagate in the dielectric line member 13. In this case, an electric field generated within the dielectric line member 13 is shown in FIGS. 4A, 4B and 4C. That is, the electric field along a propagation direction of microwaves shows a standing wave as shown in FIG. 4B, while the electric field along a direction perpendicular to the propagation direction shows an approximately uniform wave as shown in FIG. 4C. However, note that a fairly large difference in the electric field between a center portion and a peripheral portion of the dielectric line member 13 is generated as shown in FIG. 4C. Then, the microwaves within the dielectric line member 13 are diverged uniformly into the plasma generating chamber 4, and are applied to gas introduced from the gas inlet 6, to thereby excite gas plasma. Thus, the microwaves are spread broadly within the dielectric line member 13, and are diverged into the plasma generating chamber 4, thus creating a uniform plasma in a large area.

The excited plasma is accelerated by the high frequency power supply source 12 toward the substrate holder (lower electrode) 10, i.e., the semiconductor substrate 9, to thereby etch it.

Note that, when a large ion energy is required for etching, the frequency of the high frequency power supply source 12 is made smaller than 5 MHz, particularly, smaller than 400 kHz. On the other hand, when ion energy is not required for etching, the frequency of the high frequency power supply source 12 is, preferably, 1 MHz to 13.56 MHz.

Also, in FIG. 2, a plurality of permanent magnets 15 are equidistantly arranged outside of the plasma generating chamber 4, to create a multi-pole differential magnetic field within the plasma generating chamber 1. As a result, impact ionization due to electron collisions with reaction gas are increased and the magnetic field within the plasma generating chamber 4 is made more uniform, thus creating high-integrated plasma uniformly within the plasma generating chamber 4, particularly, within a space above the substrate holder 10. According to the experimental results, the uniformity of the plasma sensity is ±3% for the dry etching apparatus of FIG. 2 with the permanent magnets 15, while the uniformity of the plasma density is ±10% for the dry etching apparatus of FIG. 2 without the permanent magnets 15.

In the dry etching apparatus of FIG. 2 where the semiconductor substrate 9 uses an 8-inch wafer having a silicon dioxide layer thereon, when $CF_4$ gas having a pressure of 0.01 Torr is introduced into the plasma generating chamber 4 from the gas inlet 6 at a flow rate of 30 ml/min., and microwaves having a power of 500 W are supplied with the high frequency bias power supply source 12 having a frequency of 500 kHz and a power of 40 W applied to the substrate holder 10, the etching rate was obtained at 600 nm/min ±4%, i.e., the uniformity of the etching rate was ±4%, and smaller as compared with the uniformity of the etching rate ±10% in the prior art.

Figure 5:
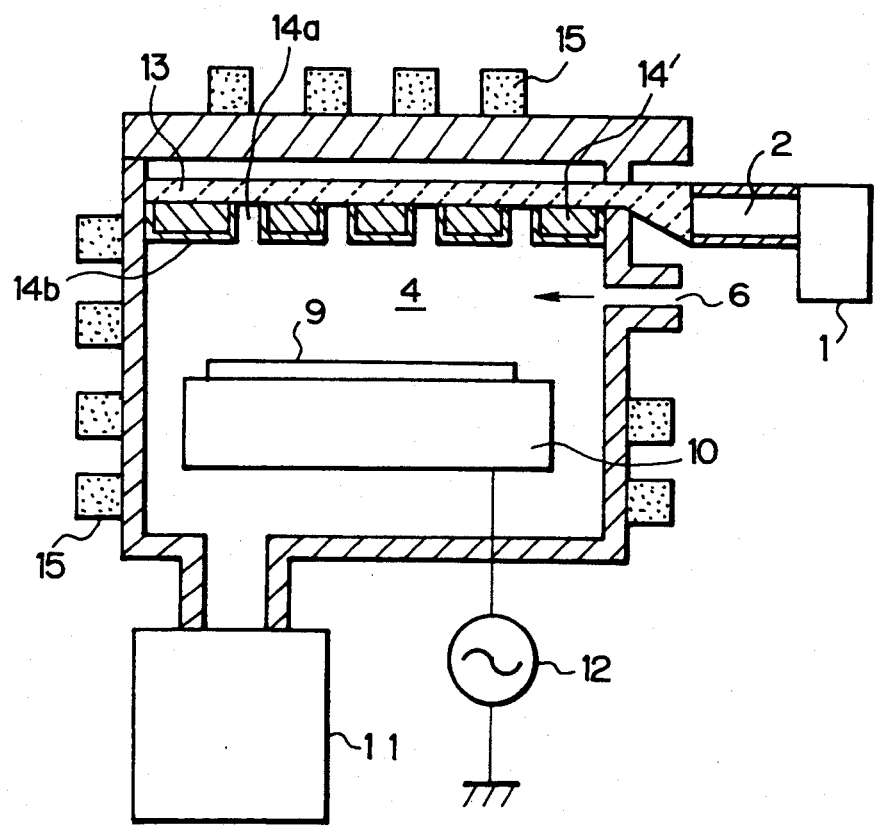
FIG. 5 is a cross-sectional view illustrating a second embodiment of the dry etching apparatus according to the present invention.

In FIG. 5, which illustrates a second embodiment of the present invention, an upper electrode 14' is provided beneath the dielectric line member 13. The upper electrode 14' has a plurality of slits 14a for introducing microwaves into the plasma generating chamber 4. The provision of the slits 14a is helpful in further making the excited plasma uniform. Also, the upper electrode 14' is deposited by an anodized aluminium film 14b, to prevent the upper electrode 14' from being contaminated.

Figure 6:
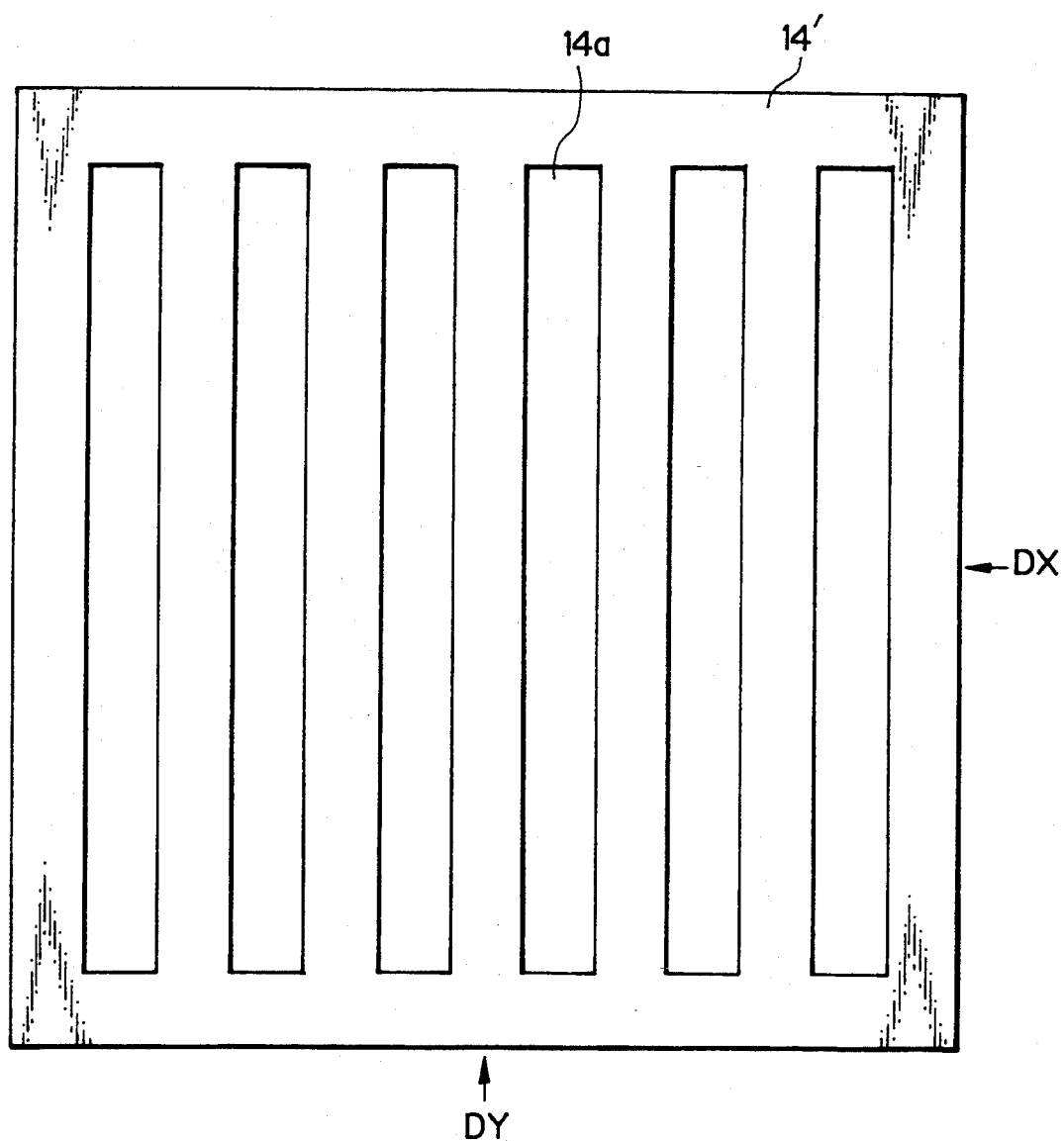
FIGS. 6, 7, 8 and 9 are plan views of the upper electrode of FIG. 5.

If the slits 14a each having the same area are equidistantly arranged as illustrated in FIG. 6, the standing wave as shown in FIG. 4B are present in the case where microwaves propagate along a direction DX, and a large difference in the generated electric field as shown in FIG. 4C is present in the case where microwaves propagate along a direction DY. That is, if an interaction between the electric field and the excited plasma is strong, the upper electrode 14' having the slits 14a as illustrated in FIG. 6 cannot generate a uniform plasma density.

Figure 7:
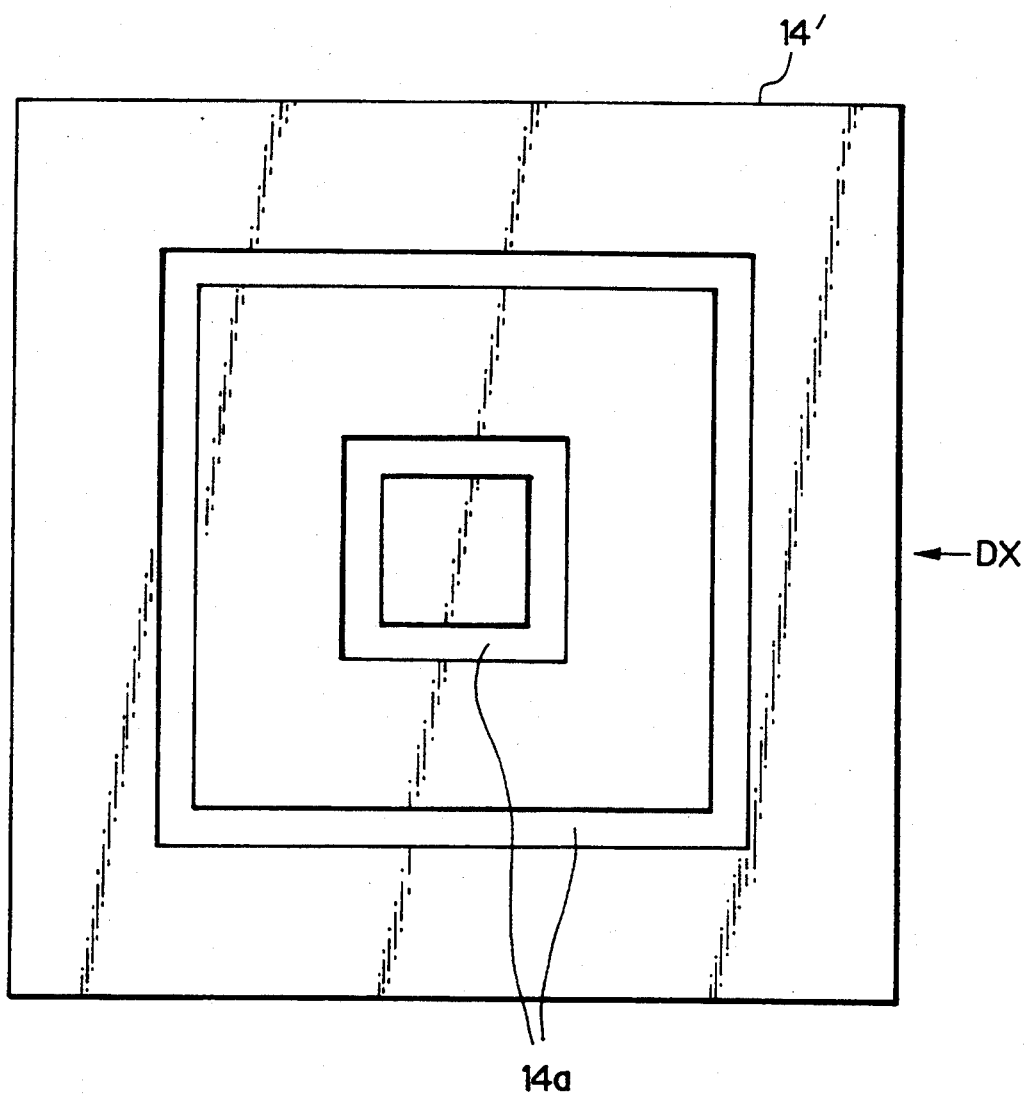

When the slits 14a of the upper electrode 14' are concentric rectangles as illustrated in FIG. 7, the standing wave as shown in FIG. 4B is suppressed, to thereby generate a more uniform plasma density. Note that the distance and number of the slits 14a can be changed in accordance with the shape of the standing wave as shown in FIG. 4B. In the dry etching apparatus of FIG. 5 with the upper electrode 14' having the slits 14a as illustrated in FIG. 7, when the above-mentioned experiment was executed, the uniformity of the etching rate was ±3%, and further was smaller than the uniformity of the etching rate in the prior art.

Figure 8:
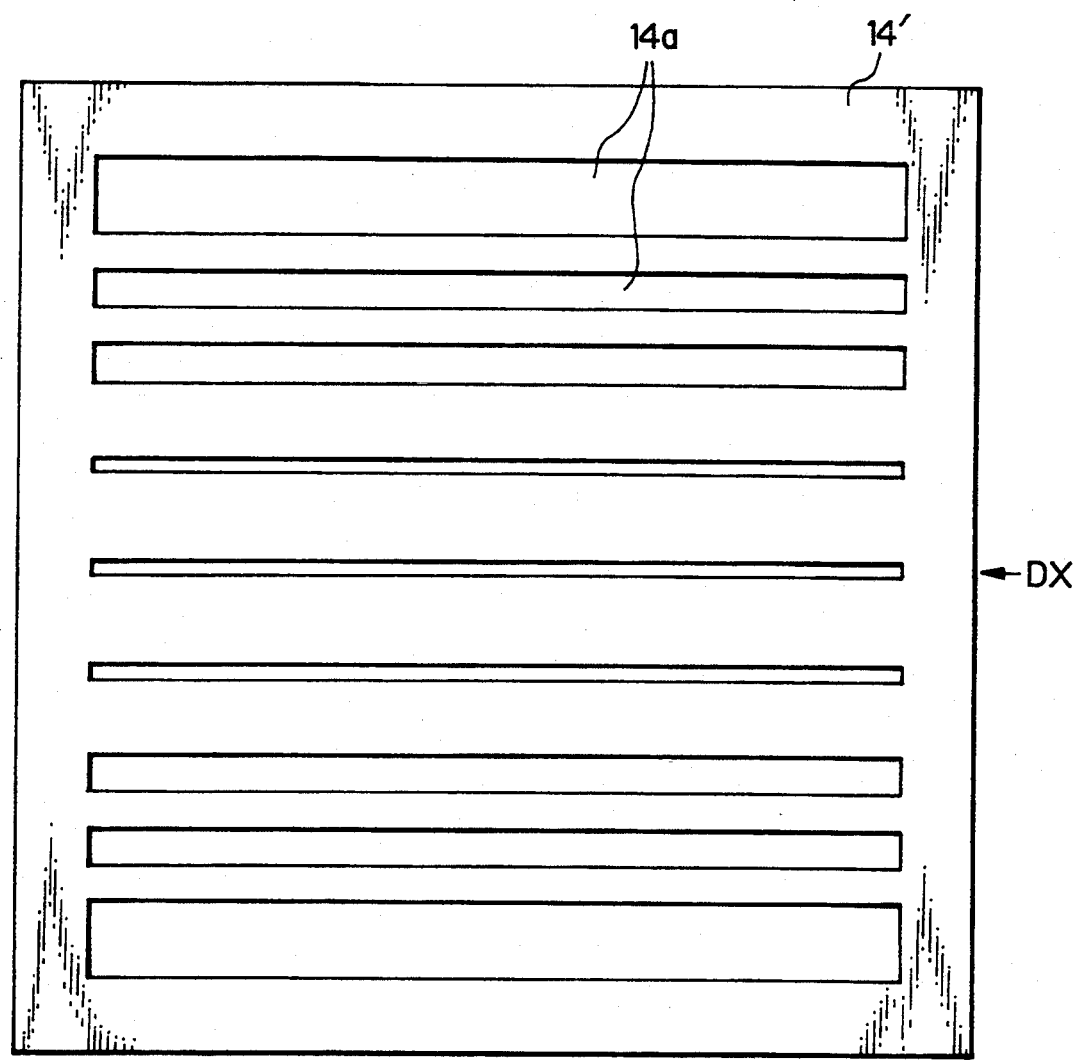

Also, when the slits 14a of the upper electrode 14 are stripes whose areas are larger in a peripheral portion than a center portion as illustrated in FIG. 8, the difference in electric field between the center portion and the peripheral portion of the dielectric line member 13 as shown in FIG. 4C is suppressed, to thereby generate a more uniform plasma density. Note that the distance and number of the slits 14a can be also changed in accordance with the shape of the electric field as shown in FIG. 4C. In the dry etching apparatus of FIG. 5 with the upper electrode 14' having the slits 14a as illustrated in FIG. 8, when the above-mentioned experiment was executed, the uniformity of the etching rate was ±2%, and further was smaller than the uniformity of the etching rate in the prior art.

Figure 9:
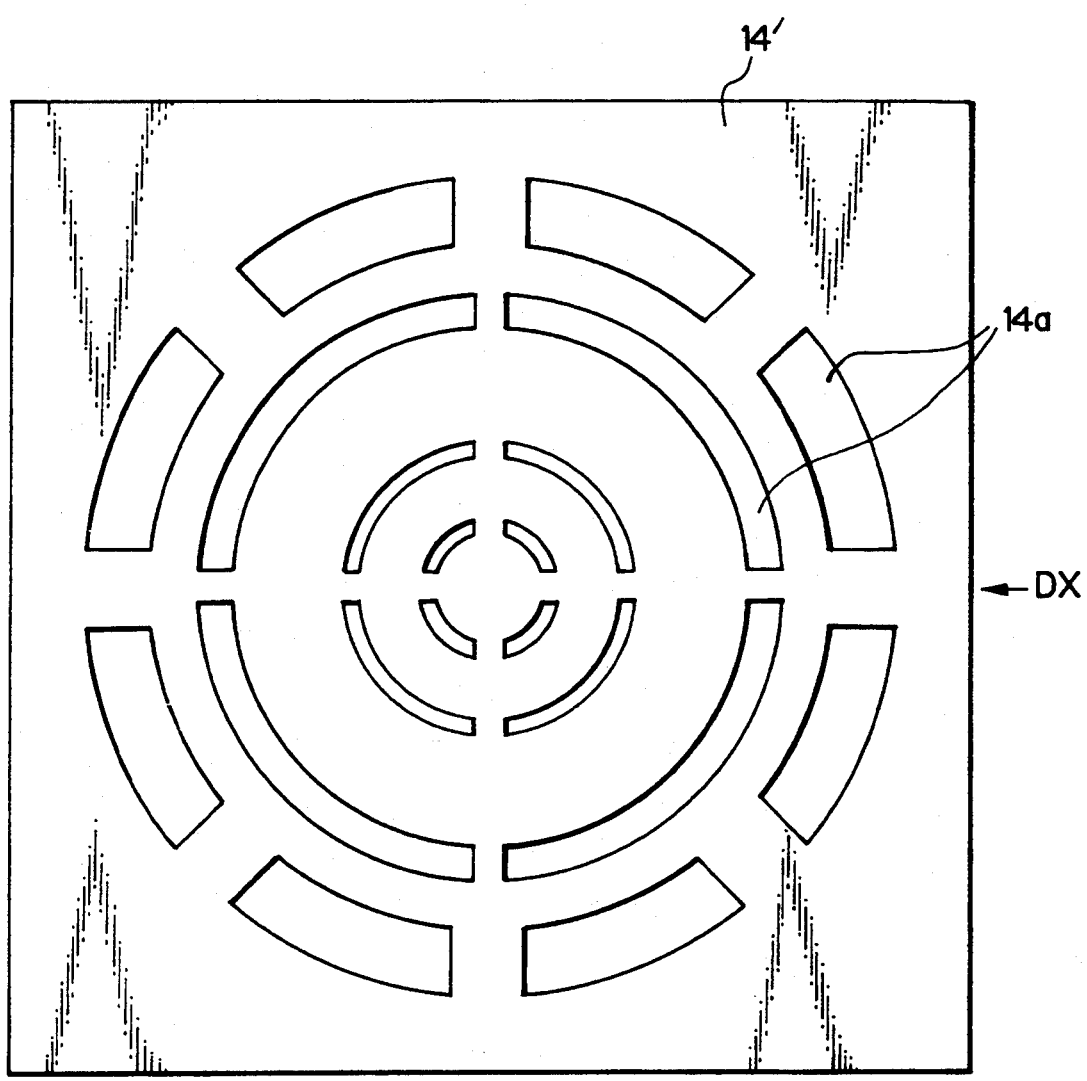

Further, when the slits 14a of the upper electrode 14 are concentric circles whose areas are larger in a peripheral portion than a center portion as illustrated in FIG. 9, the standing wave as shown in FIG. 4B is suppressed, and also the difference in electric field between the center portion and the peripheral portion of the dielectric line member 13 as shown in FIG. 4C is suppressed, to thereby generate a more uniform plasma density. Note that the distance and number of the slits 14a can be also changed in accordance with the standing wave as shown in FIG. 4B and the shape of the electric field as shown in FIG. 4C. In the dry etching apparatus of FIG. 5 with the upper electrode 14' having the slits 14a as illustrated in FIG. 9, when the above-mentioned experiment was executed, the uniformity of the etching rate was ±1%, and further was smaller than the uniformity of the etching rate in the prior art.

In the above-mentioned embodiments, although the dry etching apparatus is of a longitudinal type, the present invention can be applied to a dry etching apparatus of a lateral type.

As explained hereinbefore, according to the present invention, since the microwave introduction window and the plasma intake window which degrade the uniformity of excited plasma are not present, the excited plasma can be uniform, thus uniforming an etching rate in a large size semiconductor substrate.

Modifications of the invention herein disclosed will occur to a person skilled in the art and all such modifications are deemed to be within the scope of this invention as defined by the appended claims.

I claim:

1. A dry etching apparatus comprising:
   a plasma generating chamber;
   a first electrode mounted within said plasma generating chamber;
   a second electrode mounted within said plasma generating chamber and opposing said first electrode, for mounting a substrate to be etched,
   a microwave oscillator;
   a waveguide connected to said microwave oscillator;
   a dielectric line member, connected by an end thereof directly to said waveguide and mounted on said first electrode, for introducing microwaves into said plasma generating chamber from a microwave emission surface of said dielectric line member, said dielectric line member being arranged in parallel with a propagation direction of microwaves propagated from said waveguide; and
   a high frequency bias power supply source connected to said second electrode.

2. An apparatus as set forth in claim 1, wherein said dielectric line member is of a plate type.

3. An apparatus as set forth in claim 1, wherein said first electrode is of a plate type located between a surface of said plasma generating chamber and said dielectric line member.

4. An apparatus as set forth in claim 1, wherein said first electrode is of a plate type located on the side of the plasma emission surface of said dielectric line member, said first electrode having a plurality of slits for passing the microwaves therethrough.

5. An apparatus as set forth in claim 4, wherein the slits of said first electrode are nonequidistant stripes.

6. An apparatus as set forth in claim 4, wherein the slits of said first electrode are concentric rectangles.

7. An apparatus as set forth in claim 4, wherein the slits of said first electrode are concentric circles.

8. An apparatus as set forth in claim 4, wherein an area of each of the slits of said first electrode is dependent upon an electric field of said dielectric line member at a location of said each of the slits.

9. An apparatus as set forth in claim 1, further comprising a plurality of magnets equidistantly mounted outside of said plasma generating chamber.

* * * * *